United States Patent
Khwa

(10) Patent No.: US 11,152,066 B1
(45) Date of Patent: Oct. 19, 2021

(54) NON-VOLATILE MEMORY DEVICE AND METHOD FOR PROGRAMMING NON-VOLATILE MEMORY DEVICE

(71) Applicant: Taiwan Semiconductor Manufacturing Co., Ltd., Hsinchu (TW)

(72) Inventor: Win-San Khwa, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 16/885,288

(22) Filed: May 28, 2020

(51) Int. Cl.
*G11C 11/00* (2006.01)
*G11C 13/00* (2006.01)

(52) U.S. Cl.
CPC ........ *G11C 13/0069* (2013.01); *G11C 13/004* (2013.01); *G11C 13/0004* (2013.01); *G11C 13/0097* (2013.01)

(58) Field of Classification Search
CPC ..... G11C 3/0069; G11C 3/0004; G11C 3/004; G11C 3/0097

USPC ......................................................... 365/148
See application file for complete search history.

(56) References Cited

U.S. PATENT DOCUMENTS

2016/0336066 A1* 11/2016 Lin .................... G11C 13/0064
2018/0342297 A1* 11/2018 Kim .................... G11C 11/5628

* cited by examiner

*Primary Examiner* — Vu A Le
(74) *Attorney, Agent, or Firm* — JCIPRNET

(57) ABSTRACT

A non-volatile memory device and a method for programming a non-volatile memory device are provided. The non-volatile memory device includes a memory array and a memory controller. The memory array includes a plurality of memory cells. The memory controller is configured to regulate a programming operation by applying a program pulse generated according to a set pulse and a reset pulse to each of the memory cells. The memory controller determines whether a memory cell resistance of each of the memory cells is within a target range and apply the program pulse to each of the memory cells until the memory cell resistances of all of the memory cells are within the target range.

20 Claims, 8 Drawing Sheets

NON-VOLATILE MEMORY DEVICE AND METHOD FOR PROGRAMMING NON-VOLATILE MEMORY DEVICE

BACKGROUND

Non-volatile memory device is commonly used to store the data. The data may be programmed into the non-volatile memory device by applying a plurality of voltage pulses to the non-volatile memory device by applying a plurality of voltage pulses to the non-volatile memory device. One method of programming the non-volatile memory device is an incremental step pulse programming method, which is also known as ISPP. When programming the non-volatile memory device using the ISPP method, two different pulses, which includes a set pulse and a reset pulse, are used to make a memory cell resistance of the non-volatile memory device be within a target range. The set pulse has small amplitude with long period, and when the set pulse is applied to the non-volatile memory device, a memory cell resistance of the non-volatile memory device decreases. On the other hand, the reset pulse has large amplitude with small period, and when the reset pulse is applied to the non-volatile memory device, the memory cell resistance of the non-volatile memory device increases.

By using the ISPP method to program the non-volatile memory device, some memory cells in the non-volatile memory device may be more responsive than other memory cells in the non-volatile memory device. Therefore, variation in the memory cells results in the memory cell resistance of all of the memory cells in the non-volatile memory device not achieving the target range at the same time. As such, some memory cells, which are more responsive, needs to wait until all the memory cells in the non-volatile memory device reaches the target range. Accordingly, programming the non-volatile memory device is slow and inefficient.

Along with the requirement of fast and efficient programming in the non-volatile memory device, it is desirable to develop the non-volatile memory device in this technical field.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DESCRIPTION OF THE EMBODIMENTS

Figure 1:
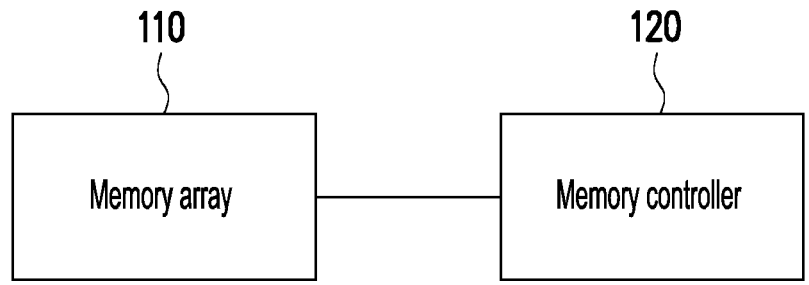
FIG. 1 illustrates a block diagram of a non-volatile memory device according to an exemplary embodiment of the disclosure.

The following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a block diagram of a non-volatile memory device according to an exemplary embodiment of the disclosure. Referring to FIG. 1, the non-volatile memory device 100 includes a memory array 110 and a memory controller 120.

The non-volatile memory device 100 is, for example, a resistive non-volatile memory device. In some embodiments, the non-volatile memory device is phase-change random access memory (PCRAM).

In some embodiment, the non-volatile memory device 100 is Mask ROM, PROM, EPROM, or EEPROM, and the type of non-volatile memory device 100 is not limited in this disclosure.

The memory array 110 includes a plurality of memory cells arranged at an intersection of a plurality of rows (also known as word lines WL) and a plurality of columns (also known as bit lines BL).

The memory controller 120 is configured to regulate a programming operation by applying a program pulse to each of the memory cells. The program pulse is a voltage pulse with an amplitude with M number of steps, where M is a positive integer. The program pulse is generated according to a set pulse and a reset pulse. The memory controller 120 also regulates an erasing operation and a reading operation in addition to the programming operation.

In some embodiments, the program pulse is a current pulse, thus the type of the program pulse applied in the programming operation is not limited in this disclosure.

The memory controller 120 determines a memory cell resistance $R_{CELL}$ of each of the memory cells in the memory array 110 with a target range and applies a program pulse to each of the memory cells in the memory array 110. The target range of the non-volatile memory device 100 is in the range of 20 Kohm to 5 Mohm. In specific, the memory controller 120 determines whether the memory cell resistance $R_{CELL}$ of each of the memory cells falls within an error margin of the target resistance, that is, the target range.

In one example, the error margin of the target resistance is 10% of the target resistance.

In another example, the error margin of the target resistance is a predetermined range and is determined by a user or an external device. It is noted that, the error margin of the target resistance is not limited in the disclosure.

In some embodiments, when the memory cell resistance $R_{CELL}$ of each of the memory cells is greater than the target range, the memory controller 120 applies the program pulse to the memory cells in the memory array 110. In other words, the program pulse behaves as a set pulse, which results in decreasing the memory cell resistance $R_{CELL}$ of the memory cells in the memory array 110.

On the other hand, when the memory cell resistance $R_{CELL}$ of each of the memory cells in the memory array 110 are within the target range, the memory controller 120 stops applying the program pulse to the memory cells in the memory array 110.

Moreover, when the memory cell resistance $R_{CELL}$ of each of the memory cells is less than the target range, the memory controller 120 applies the program pulse to the memory cells in the memory array 110. In other words, the program pulse behaves as a reset pulse in this condition, which results in decreasing the memory cell resistance $R_{CELL}$ of the memory cells in the memory array 110.

Figure 2:
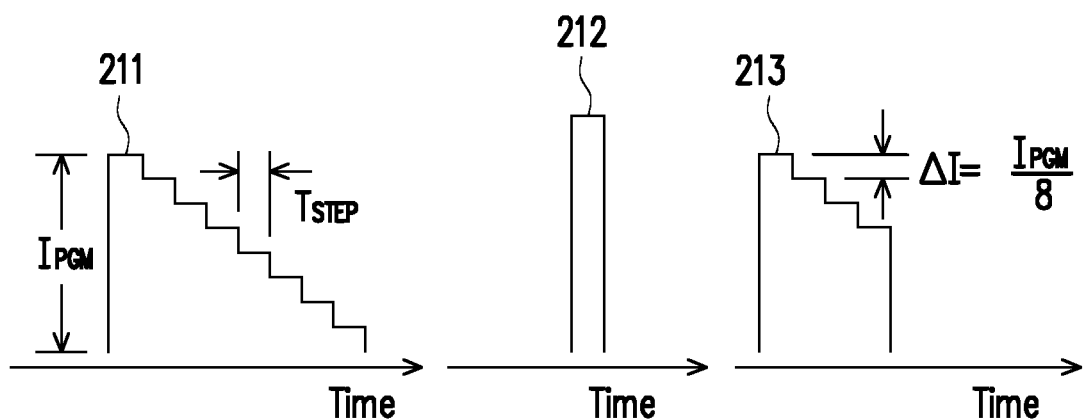
FIG. 2 illustrates a program pulse for a non-volatile memory device according to an exemplary embodiment of the disclosure.

FIG. 2 illustrates a program pulse for a non-volatile memory device according to an exemplary embodiment of the disclosure. In FIG. 2, the horizontal axis illustrates the time and the vertical axis illustrates a programming current $I_{PGM}$ corresponding to a program pulse.

In FIG. 2, a set pulse 211 having N steps (N=8) is shown, in which the number of steps in the set pulse 211 is an example and the amplitude of the set pulse 211 is corresponding to the programming current $I_{PGM}$.

In some embodiments, the number of steps N in the set pulse 211 is not limited.

Referring to FIG. 2, a reset pulse 212 with one step is shown and the amplitude of the reset pulse 212 is greater than the amplitude of the set pulse 211. In other words, the set pulse 211 has small amplitude with long period. On the other hand, the reset pulse 212 has large amplitude with small period.

With reference to FIG. 1, when the set pulse 211 is applied to a plurality of memory cells in a memory array 110, the memory cell resistance $R_{CELL}$ decreases. On the contrary, when the reset pulse 212 is applied to the memory cells in the memory array 110, the memory cell resistance $R_{CELL}$ increases.

In FIG. 2, the set pulse 211 corresponds to N steps while the program pulse 213 corresponds N/2 steps, and an amplitude of the program pulse 213 is between an amplitude of the set pulse 211 and an amplitude of the reset pulse 212. In some embodiments, the program pulse 213 includes a portion of a plurality of steps in the set pulse 211 and an amplitude of the program pulse 213 is between an amplitude of the set pulse 211 and an amplitude of the reset pulse 212. In another aspect, the program current $I_{PGM}$ corresponds to the program pulse 213 is adjusted. The difference between a plurality of program currents of the plurality of steps in the program pulse is equal to a ratio of a program current of the set pulse 211 to a number of the steps in the set pulse 211. That is, the difference between the program currents of the plurality of the steps is determined as $\Delta I=I_{PGM}/N$.

Figure 3:
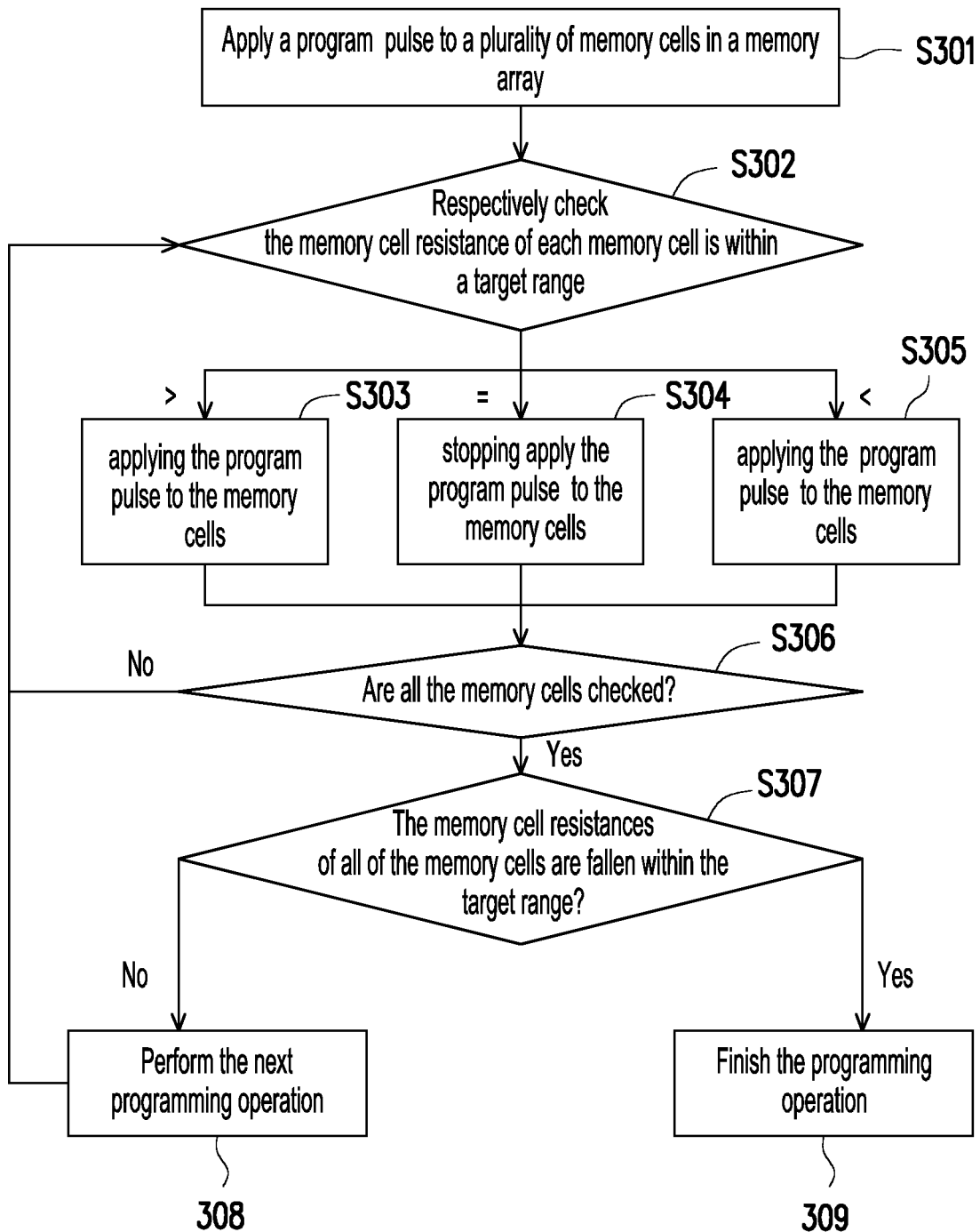
FIG. 3 illustrates a flowchart for programming a non-volatile memory device according to an exemplary embodiment of the disclosure.

FIG. 3 illustrates steps for programming a non-volatile memory device 100 as shown in FIG. 1. In step S301, the memory controller 120 is configured to regulate a programming operation by applying a program pulse to each of a plurality of memory cells in the memory array 110.

In step S302, the memory controller 120 respectively checks whether a memory cell resistance $R_{CELL}$ of each of the memory cells in the memory array 110 is within a target range.

When the memory cell resistance $R_{CELL}$ of the memory cell in the memory array 110 is greater than the target range, the memory controller 120 applies the program pulse 213 with reference to FIG. 2, to the memory cells in step S303. During this period, the program pulse 213 behaves as a set pulse 211 with reference to FIG. 2. In other words, the memory cell resistance $R_{CELL}$ of the memory cells decreases by applying the program pulse 213 during this period.

On the other hand, when the memory cell resistance $R_{CELL}$ of the memory cells in the memory array 110 is within the target range, in step S304, the memory controller 120 stops applying the program pulse 213 to the memory cells.

When the memory cell resistance $R_{CELL}$ of each of the memory cells is less than the target range, in step S305, the memory controller 120 applies the program pulse to the memory cells in the memory array 110. During this period, the program pulse 213 behaves as a reset pulse 212 with reference to FIG. 2. In other words, the memory cell resistance $R_{CELL}$ of the memory cells increases by applying the program pulse 213. It is noted that, the same pulse (i.e. the program pulse) is applied to the memory cells in the memory array 110 instead of applying the set pulse and the reset pulse in the programming operation in the memory cells.

In step S306, the memory controller 120 determines whether all of the memory cells in the memory array 110 are checked. It is noted that, checking each of the memory cells in the memory array 110 is comparing each of the memory cell resistance $R_{CELL}$ of the memory cell with the target range. If there is a memory cell in the memory array 110 not checked, the programming operation return to step S302. If all of the memory cells in the memory array 110 are checked, the programming operation proceeds to step S307.

In step S307, the memory controller 120 determines whether the memory cell resistances of all of the memory cells in the memory array 110 are fallen within the target range. If the memory cell resistances of all of the memory cells in the memory array 110 are fallen within the target range, the memory controller 120 finishes the programming operation in the memory device 100 in step S309. On the other hand, if there are memory cells in the memory array 110 having memory cell resistances not fallen within the target range, the memory controller 120 performs the next programming operation on the memory device 100 in step S308 and returns the programming operation to step S302.

Figure 4:
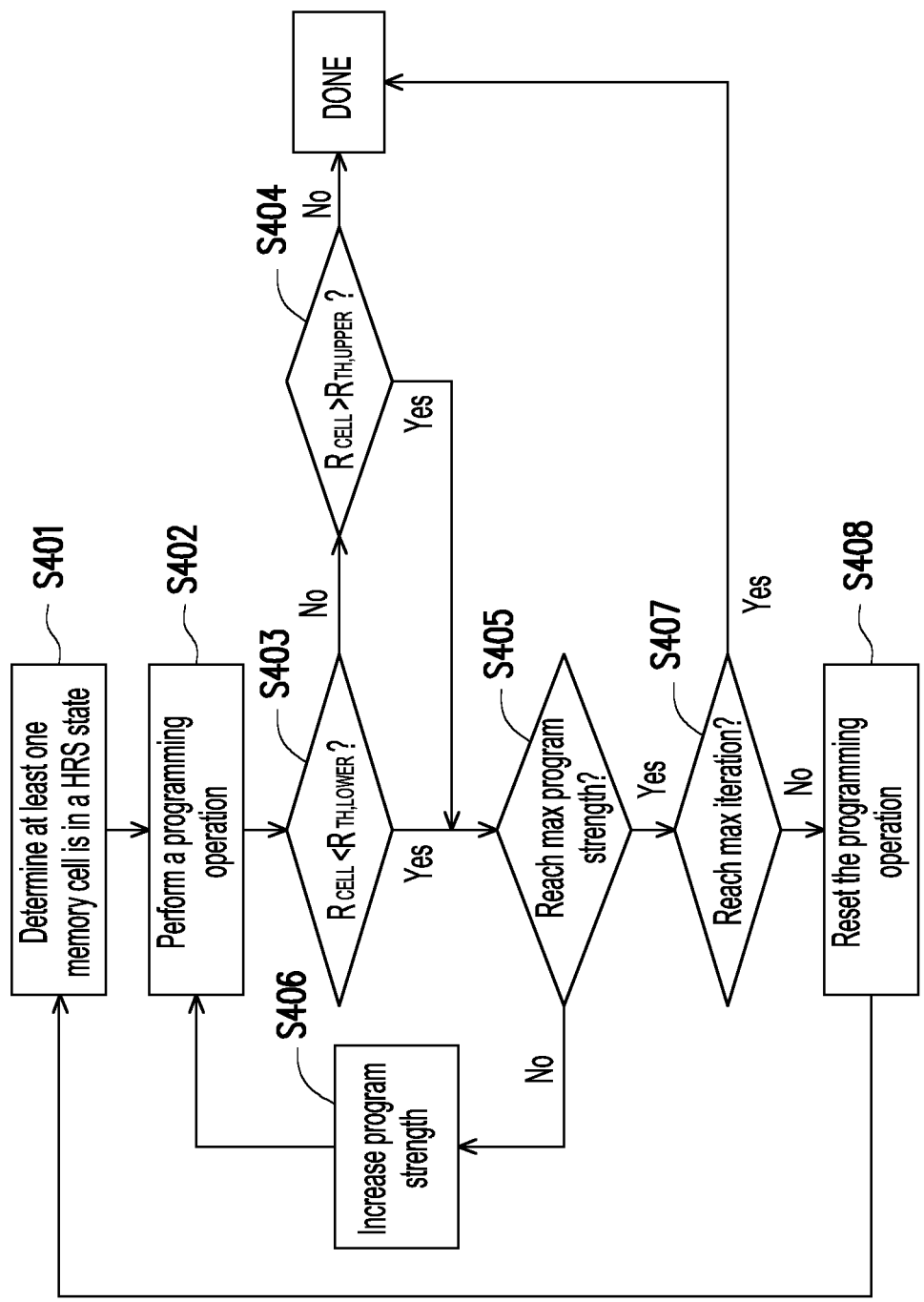
FIG. 4 illustrates a flowchart for programming a non-volatile memory device according to another exemplary embodiment of the disclosure.

FIG. 4 illustrates steps for programming a non-volatile memory device 100 as shown in FIG. 1. In step S401, the memory controller 120 determines at least one memory cell in the memory array 110 is in a high resistance state, which is also known as the HRS state. If the memory cell is in the HRS state, the memory controller 120 performs a programming operation, by applying a program pulse 213, with reference to FIG. 2 to the memory cell in step S402.

During the programming operation, the memory controller 120 compares a memory cell resistance $R_{CELL}$ of the memory cell with a lower resistance threshold $R_{TH,LOWER}$, in step S403. If the memory cell resistance $R_{CELL}$ is less than $R_{TH,LOWER}$, the memory controller 120 determines whether the memory cell reaches the maximum program strength in step S405. If the memory cell does not reach the maximum program strength, the memory controller increases the program strength by applying the program pulse 213 to the memory cell in step S406 and returns the programming operation to step S402.

On the other hand, if the memory cell resistance $R_{CELL}$ is not smaller than $R_{TH,LOWER}$, the memory controller 120 proceeds to a next step by comparing the memory cell resistance $R_{CELL}$ with a upper resistance threshold $R_{TH,UPPER}$ in step S404. If the memory cell resistance $R_{CELL}$ is greater than the $R_{TH,UPPER}$, the memory controller 120 proceeds to step S405. On contrary, if the memory cell resistance $R_{CELL}$ is not greater than the $R_{TH,UPPER}$, the memory controller stops performing the programming operation on the memory cell in the memory array 120.

If it is determined the memory cell reaches the maximum program strength in step S405, the memory controller 120 determines whether the memory cell reaches the maximum iteration in the programming operation in step S407. If the memory cell reaches the maximum iteration, then the memory controller 120 stops performing the programming operation on the memory cell in the memory array 120. On the other hand, if the memory cell does not reach the maximum iteration, the memory controller 120 resets the programming operation in the memory device 100 in step S408. In other words, memory controller 120 starts the programming operation with the weaker strength, increases the iteration counter for the memory cell in the memory array 110 and returns back to step S401.

Figure 5:
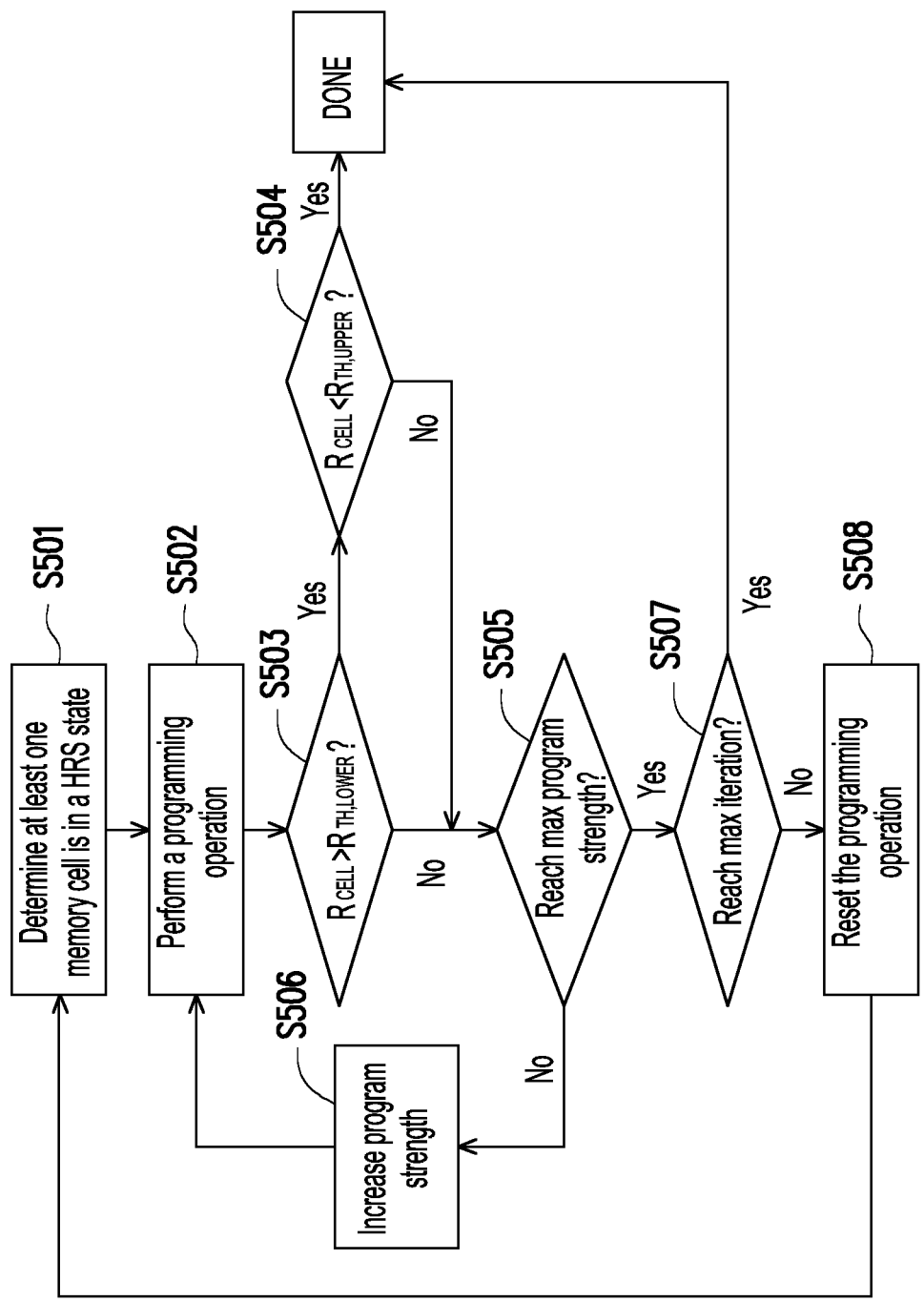
FIG. 5 illustrates a flowchart for programming a non-volatile memory device according to another exemplary embodiment of the disclosure.

FIG. 5 illustrates steps included in programming a non-volatile memory device 100 as shown in FIG. 1. With reference to FIG. 5, the steps S501 and S502 are respectively similar to steps S401 and S402 in FIG. 4, thus the detailed descriptions of steps S501 and S502 are omitted herein.

During the programming operation, the memory controller 120 compares a memory cell resistance $R_{CELL}$ of the memory cell with a lower resistance threshold $R_{TH,LOWER}$, in step S503. If the memory cell resistance $R_{CELL}$ is not greater than the $R_{TH,LOWER}$, the memory controller 120 determines whether the memory cell reaches the maximum program strength in step S505. If the memory cell does not reach the maximum program strength, the memory controller increases the program strength by applying the program pulse 213, with reference to FIG. 2 to the memory cell in step S506 and returns the programming operation to step S502.

On the other hand, if the memory cell resistance $R_{CELL}$ is greater than the $R_{TH,LOWER}$, the memory controller 120 proceeds to a next step by comparing the memory cell resistance $R_{CELL}$ with a upper resistance threshold $R_{TH,UPPER}$ in step S504. If the memory cell resistance $R_{CELL}$ is not less than the $R_{TH,UPPER}$, the memory controller 120 proceeds to step S505. On contrary, if the memory cell resistance $R_{CELL}$ is less than the $R_{TH,UPPER}$, the memory controller stops performing the programming operation on the memory cell in the memory array 120.

If it is determined the memory cell reaches the maximum program strength in step S505, the memory controller 120 determines whether the memory cell reaches the maximum iteration in the programming operation in step S507. If the memory cell reaches the maximum iteration, then the memory controller 120 stops performing the programming operation on the memory cell in the memory array 120. On the other hand, if the memory cell does not reach the maximum iteration, the memory controller 120 resets the programming operation in the memory device 100 in step S508. In other words, memory controller 120 starts the programming operation with the weaker strength, increases the iteration counter for the memory cell in the memory array 110 and returns back to step S501.

Figure 6:
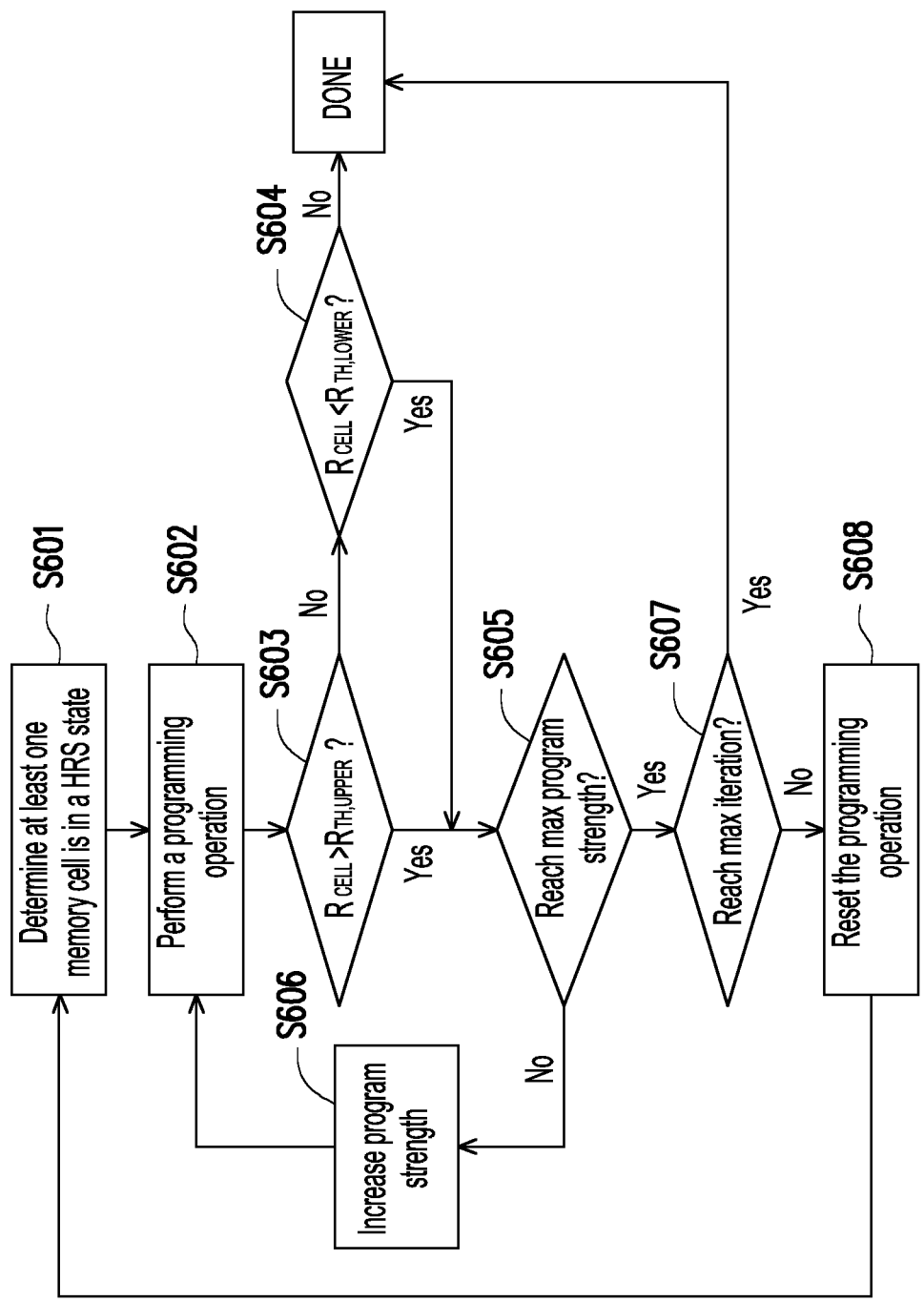
FIG. 6 illustrates a flowchart for programming a non-volatile memory device according to yet another exemplary embodiment of the disclosure.

FIG. 6 illustrates steps for programming a non-volatile memory device 100 as shown in FIG. 1. With reference to FIG. 6, the steps S601 and S602 are respectively similar to steps S401 and S402 in FIG. 4, thus the detailed description of steps S601 and S602 are omitted herein.

During the programming operation, the memory controller 120 compares a memory cell resistance $R_{CELL}$ of the memory cell with a upper resistance threshold $R_{TH,UPPER}$, in step S603. If the memory cell resistance $R_{CELL}$ is greater than the $R_{TH,UPPER}$, the memory controller 120 determines whether the memory cell reaches the maximum program strength in step S605. If the memory cell does not reach the maximum program strength, the memory controller increases the program strength by applying the program pulse 213, with reference to FIG. 2 to the memory cell in step S606 and returns the programming operation to step S602.

On the other hand, if the memory cell resistance $R_{CELL}$ is not greater than the $R_{TH,UPPER}$, the memory controller 120 proceeds to a next step by comparing the memory cell resistance $R_{CELL}$ with a lower resistance threshold $R_{TH,LOWER}$ in step S604. If the memory cell resistance $R_{CELL}$ is less than the $R_{TH,LOWER}$, the memory controller 120 proceeds to step S605. On contrary, if the memory cell resistance $R_{CELL}$ is not less than the $R_{TH,LOWER}$, the memory controller stops performing the programming operation on the memory cell in the memory array 120.

If it is determined the memory cell reaches the maximum program strength in step S605, the memory controller 120 determines whether the memory cell reaches the maximum iteration in the programming operation in step S607. If the memory cell reaches the maximum iteration, then the memory controller 120 stops performing the programming operation on the memory cell in the memory array 120. On the other hand, if the memory cell does not reach the maximum iteration, the memory controller 120 resets the programming operation in the memory device 100 in step S608. In other words, memory controller 120 starts the programming operation with the weaker strength, increases iteration counter for the memory cell in the memory array 110 and returns back to step S601.

Figure 7:
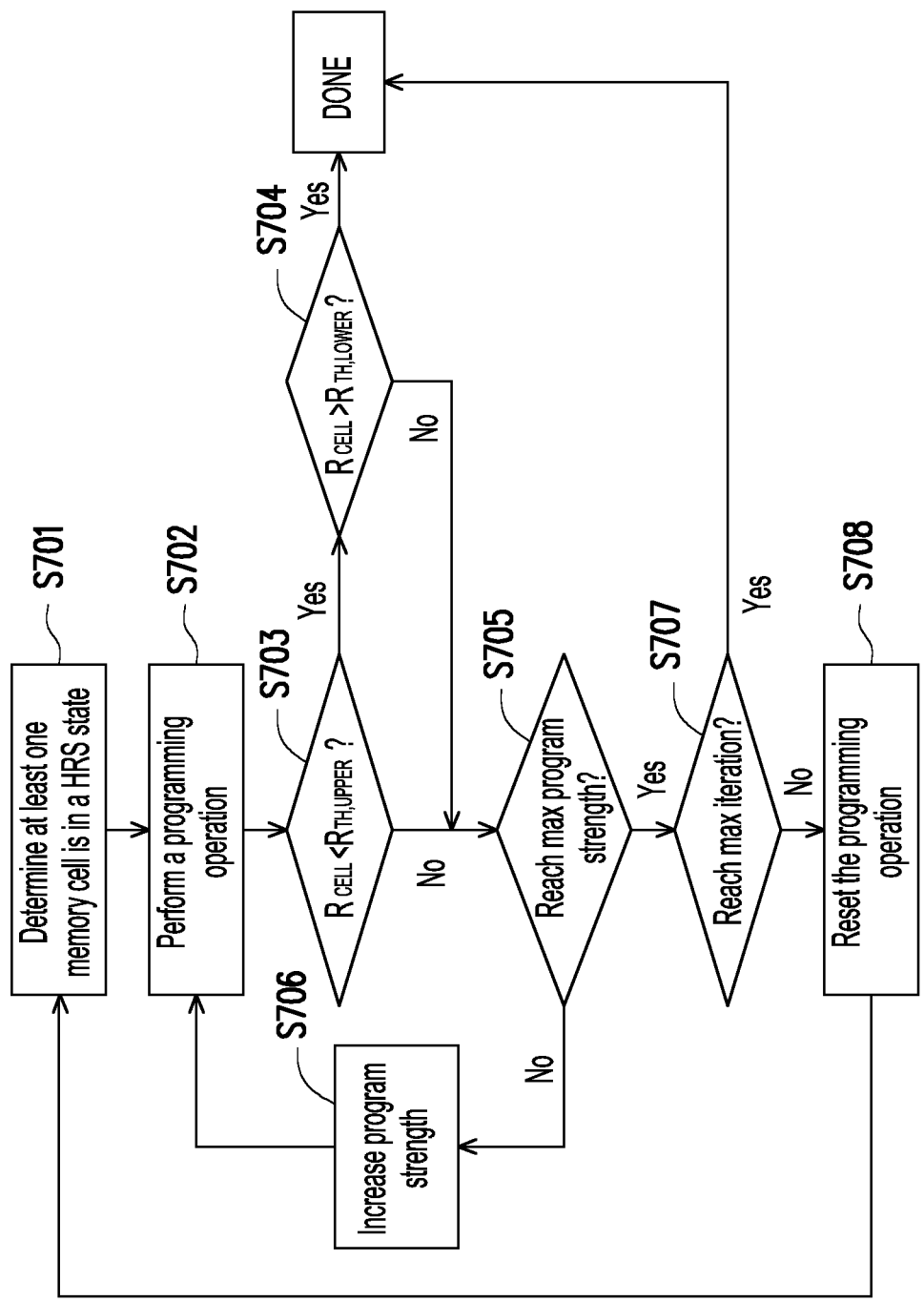
FIG. 7 illustrates a flowchart for programming a non-volatile memory device according to yet another exemplary embodiment of the disclosure.

FIG. 7 illustrates steps for programming a non-volatile memory device 100 as shown in FIG. 1. With reference to FIG. 7, the steps S701 and S702 are respectively similar to steps S401 and S402 in FIG. 4, thus the detailed description of steps S701 and S702 are omitted herein.

During the programming operation, the memory controller 120 compares a memory cell resistance $R_{CELL}$ of the memory cell with a upper resistance threshold $R_{TH,UPPER}$, in step S703. If the memory cell resistance $R_{CELL}$ is not less than the $R_{TH,UPPER}$, the memory controller 120 determines whether the memory cell reaches the maximum program strength in step S705. If the memory cell does not reach the maximum program strength, the memory controller increases the program strength by applying the program pulse 213, with reference to FIG. 2 to the memory cell in step S706 and returns the programming operation to step S702.

On the other hand, if the memory cell resistance $R_{CELL}$ is less than the $R_{TH,UPPER}$, the memory controller 120 proceeds to a next step by comparing the memory cell resistance $R_{CELL}$ with a lower resistance threshold $R_{TH,LOWER}$ in step S704. If the memory cell resistance $R_{CELL}$ is not greater than the $R_{TH,LOWER}$, the memory controller 120 proceeds to step S705. On contrary, if the memory cell resistance $R_{CELL}$ is greater than the $R_{TH,LOWER}$, the memory controller stops performing the programming operation on the memory cell in the memory array 120.

If it is determined the memory cell reaches the maximum program strength in step S705, the memory controller 120 determines whether the memory cell reaches the maximum iteration in the programming operation in step S707. If the memory cell reaches the maximum iteration, then the memory controller 120 stops performing the programming operation on the memory cell in the memory array 120. On the other hand, if the memory cell does not reach the maximum iteration, the memory controller 120 resets the programming operation in the memory device 100 in step S708. In other words, memory controller 120 starts the programming operation with the weaker strength, increases the iteration counter for the memory cell in the memory array 110 and returns back to step S701.

Figure 8A:
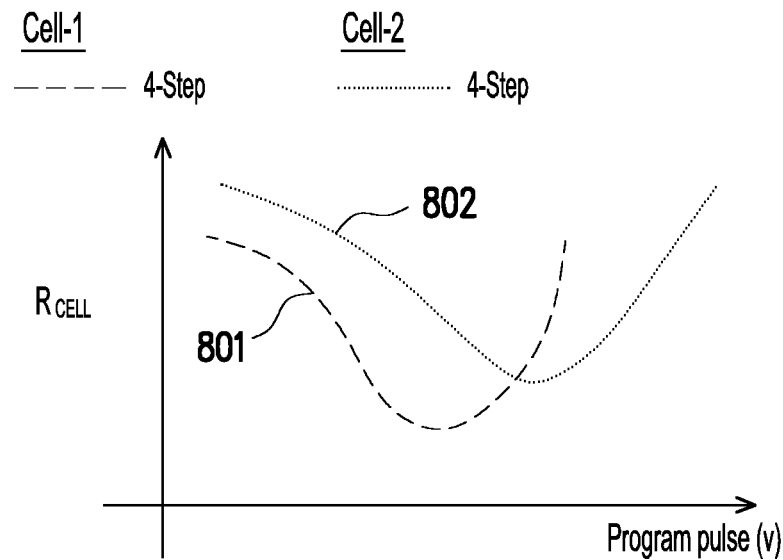
FIG. 8A a memory cell resistance of a plurality of memory cells in the memory array in the non-volatile memory device according to an exemplary embodiment of the disclosure.

FIG. 8A illustrates a variation of memory cell resistances of memory cells in a non-volatile memory device according to an exemplary embodiment of the disclosure. In FIG. 8A, the horizontal axis illustrates a program pulse while the vertical axis illustrates the memory cell resistances $R_{CELL}$ of the memory cells in the memory array corresponding to a program pulse.

In this embodiment, two memory cells cell-1 and cell-2 are used to compare the memory cell resistance $R_{CELL}$ of the memory cells corresponding to the program pulse 213, with reference to FIG. 2. It is noted that, the cell-1 is more responsive to the program pulse 212 than the cell-2. In other words, by applying the same program pulse to the cell-1 and the cell-2, the cell-1 is more responsive to reach a target range than the cell-2. In detail, when the program pulse 213 is applied to the cell-1 and the cell-2, the variation curve 801 of the memory cell resistance corresponding to the cell-1 is more responsive than the variation curve 802 of the memory cell resistance corresponding to the cell-2.

It is noted that the behavior of the variation curve 801 and the variation curve 802, shows that when the program pulse 213 is applied to the cell-1 and the cell-2, the memory cell resistance $R_{CELL}$ decreases at first, which behaves as a set pulse 211. Then, the memory cell resistance $R_{CELL}$ increases with respect to the program pulse 213. In other words, during this period, the program pulse 213 behaves as a reset pulse 212. It is noted that, the variation curve 801 and the variation curve 802 is a u-shape curve. In specific, the variation curve 801 and the variation curve 802 decreases at first and then increases with respect to the program pulse 213.

Figure 8B:
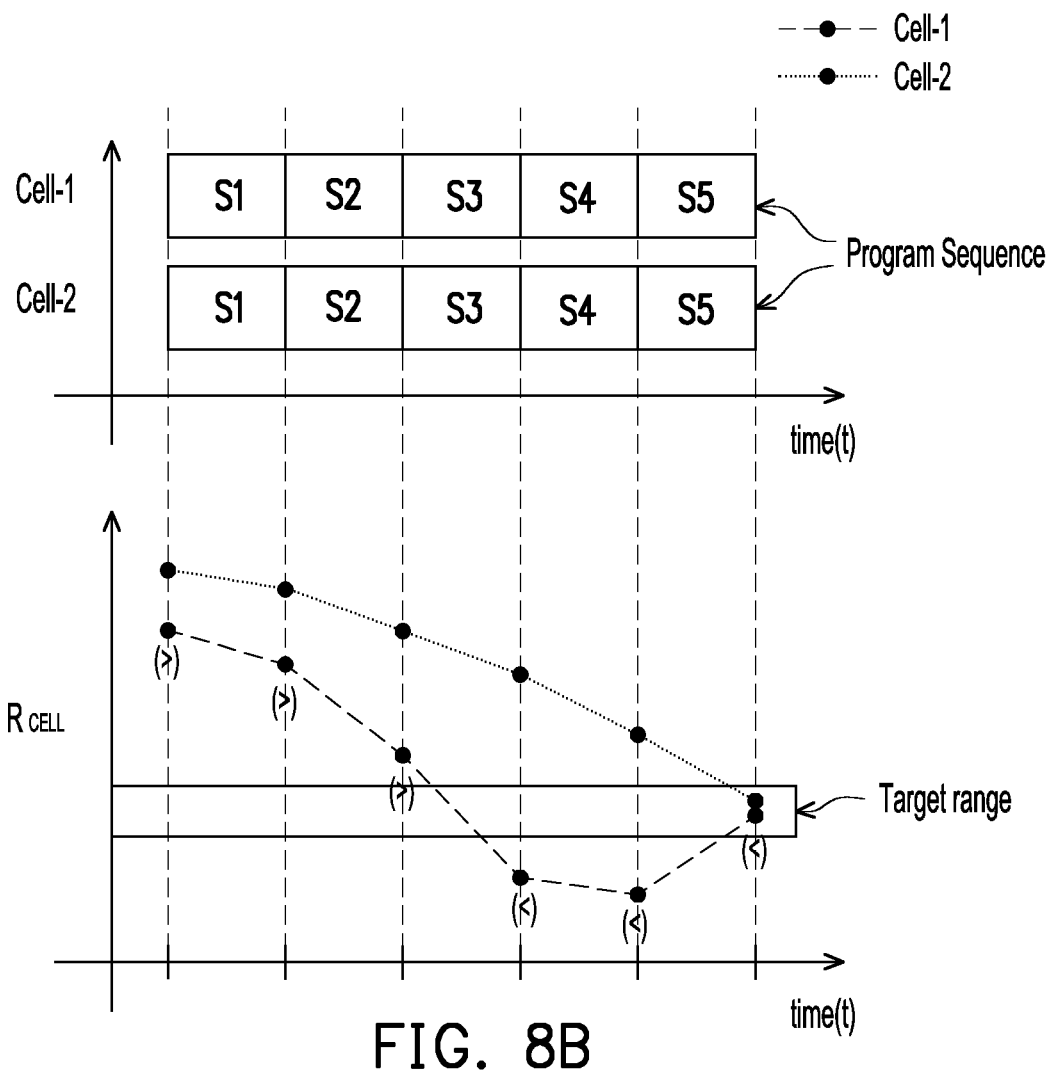
FIG. 8B a programming operation in the non-volatile memory device according to an exemplary embodiment of the disclosure.

FIG. 8B illustrates a programming operation in memory cells in a memory array according to an exemplary embodiment of the disclosure. Referring to FIG. 1, two memory cells cell-1, cell-2 are used to determine the programming operation in the memory array 110 in this embodiment. It is noted that, the cell-1 is more responsive than the cell-2. In FIG. 8B, the horizontal axis illustrates a program sequence in the programming operation and the vertical axis illustrates a memory cell resistance $R_{CELL}$ of the memory cells in the memory array corresponding to a program pulse.

With reference to the program sequence in FIG. 8B, during stage S1, the memory controller 120 first determines whether the memory cell resistances $R_{CELL}$ of the cell-1 and the cell-2 are within a target range. As the memory cell resistances $R_{CELL}$ of the cell-1 and the cell-2 are greater than the target range, the memory controller 120 applies a program pulse to the cell-1 and the cell-2. During this stage, the program pulse behaves like a set pulse, which reduces the memory cell resistance $R_{CELL}$ of the cell-1 and the cell-2. It is noted that due to the cell-1 is more responsive than the cell-2, the memory cell resistance $R_{CELL}$ of the cell-1 goes towards the target range much faster than the memory cell resistance $R_{CELL}$ of the cell-2.

During stage S2, the memory controller 120 first determines whether the memory cell resistances $R_{CELL}$ of the cell-1 and the cell-2 are within the target range. As the determination results shows that the memory cell resistances $R_{CELL}$ of the cell-1 and the cell-2 are greater than the target range, the memory controller 120 applies the program pulse 213, with reference to FIG. 2 to reduce the memory cell resistances $R_{CELL}$ of the cell-1 and the cell-2 further to make the memory cell resistances $R_{CELL}$ of the cell-1 and the cell-2 close the target range. During this stage, the program pulse also behaves as the set pulse 211 to reduce the memory cell resistances $R_{CELL}$ of the cell-1 and the cell-2.

In stage S3, the memory controller 120 first determines whether the memory cell resistances $R_{CELL}$ of the cell-1 and the cell-2 are within the target range. As the determination results shows that the memory cell resistances $R_{CELL}$ of the cell-1 and the cell-2 are greater than the target range, the memory controller 120 applies the program pulse 213 to reduce the memory cell resistances $R_{CELL}$ of the cell-1 and the cell-2 further to make the memory cell resistances $R_{CELL}$ of the cell-1 and the cell-2 close the target range. It is noted that the stage S3 is similar to stage S2.

In stage S4, the memory controller 120 first determines whether the memory cell resistances $R_{CELL}$ of the cell-1 and the cell-2 are within the target range. As the determination results shows that the memory cell resistance $R_{CELL}$ of the cell-1 is less than the target range and the memory cell resistance $R_{CELL}$ of the cell-2 is greater than the target range, the memory controller 120 applies the program pulse to the cell-1 to reduce the decreasing of the memory cell resistance $R_{CELL}$ of the cell-1 to make the memory cell resistance $R_{CELL}$ of the cell-1 close to the target range. On the other hand, the memory controller 120 applies the program pulse 213 to the cell-2 to decrease the memory cell resistance $R_{CELL}$ of the cell-2 to make the memory cell resistance $R_{CELL}$ of the cell-2 close to the target range. In other words, the program pulse 213 behaves as a reset pulse 212 in the cell-1, thereby reducing the decreasing of the memory cell resistance $R_{CELL}$ of the cell-1. On contrary, the program pulse 213 behaves as the set pulse 211 in the cell-2, thereby decreasing the memory cell resistance $R_{CELL}$ of the cell-2.

In stage S5, the memory controller 120 first determines whether the memory cell resistances $R_{CELL}$ of the cell-1 and the cell-2 within the target range. As the determination results shows that the memory cell resistance $R_{CELL}$ of the cell-1 is less than the target range and the memory cell resistance $R_{CELL}$ of the cell-2 is greater than the target range, the memory controller 120 applies the program pulse to the cell-1 to increase the memory cell resistance $R_{CELL}$ of the cell-1 to make the memory cell resistance $R_{CELL}$ of the cell-1 close to the target range. On the other hand, the memory controller 120 applies the program pulse 213 to the cell-2 to decrease the memory cell resistance $R_{CELL}$ of the cell-2 to make the memory cell resistance $R_{CELL}$ of the cell-2 close to the target range. In other words, the program pulse 213 behaves as a reset pulse 212 in the cell-1, thereby increasing the memory cell resistance $R_{CELL}$ of the cell-1. On contrary, the program pulse 213 behaves as the set pulse 211 in the cell-2, thereby decreasing the memory cell resistance $R_{CELL}$ of the cell-2.

After the memory controller 120 applies the program pulse 213 respectively to the cell-1 and the cell-2, both the memory cell resistances $R_{CELL}$ of the cell-1 and the cell-2 finally reach the target range. It is noted that the memory controller 120 keeps applying the program pulse 213 to the cell-1 and the cell-2 until the memory cell resistances $R_{CELL}$ of the cell-1 and the cell-2 reach the target range. By applying the same program pulse 213 to the memory cells in the memory array 110, a waiting time of the memory cells in the non-volatile memory device 100 to reach the target range is avoided, and therefore the programming operation in the non-volatile memory device 100 is improved and the efficiency is enhanced.

Figure 9:
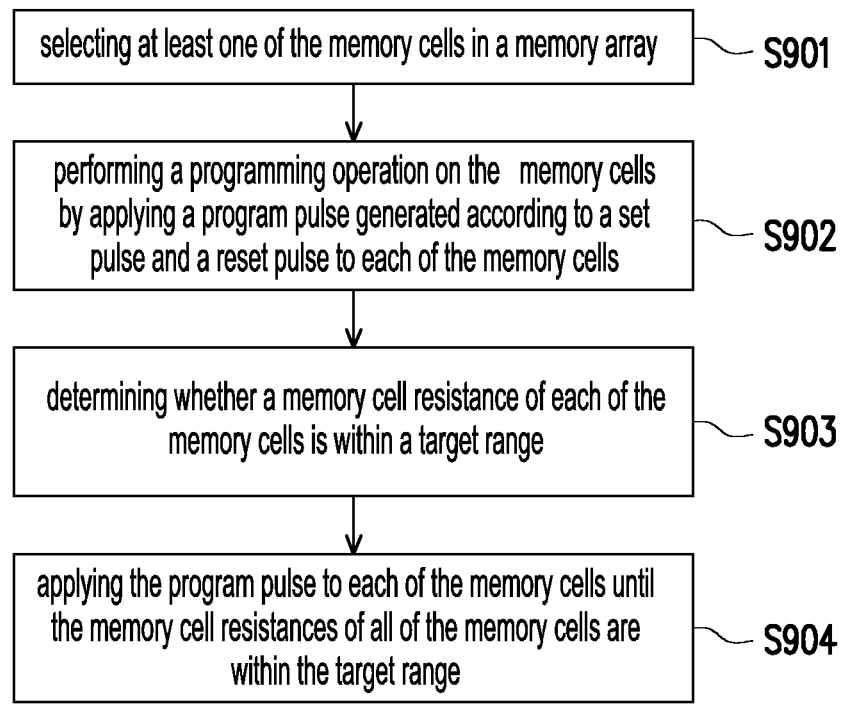
FIG. 9 illustrates a flowchart for programming a non-volatile memory device according to yet another exemplary embodiment of the disclosure.

FIG. 9 illustrates a method for programming a non-volatile memory device comprising a plurality of memory cells and a memory controller, the method includes following steps:

In step S901, the memory controller 120 selects at least one of the memory cells in the memory array 110 with reference to FIG. 1.

In step S902, the memory controller 120 performs a programming operation on the memory cells by applying a program pulse 213 generated according to a set pulse and a reset pulse to each of the memory cells.

In step S903, the memory controller 120 determines whether a memory cell resistance $R_{CELL}$ of each of the memory cells is within a target range. In other words, the memory controller 120 compares the memory cell resistance $R_{CELL}$ of each of the memory cells in the memory array 110 with the target range.

Based on the determination result, in step S904, the memory controller 120 applies the program pulse 213, with reference to FIG. 2 to each of the memory cells until the memory cell resistances $R_{CELL}$ of all of the memory cells are within the target range.

By applying the same program pulse 213 to the memory cells in the memory array 110, waiting time of the memory cells in the non-volatile memory device 100 to reach the target range is avoided, and therefore the programming operation in the non-volatile memory device 100 is improved and the efficiency is enhanced.

Figure 10:
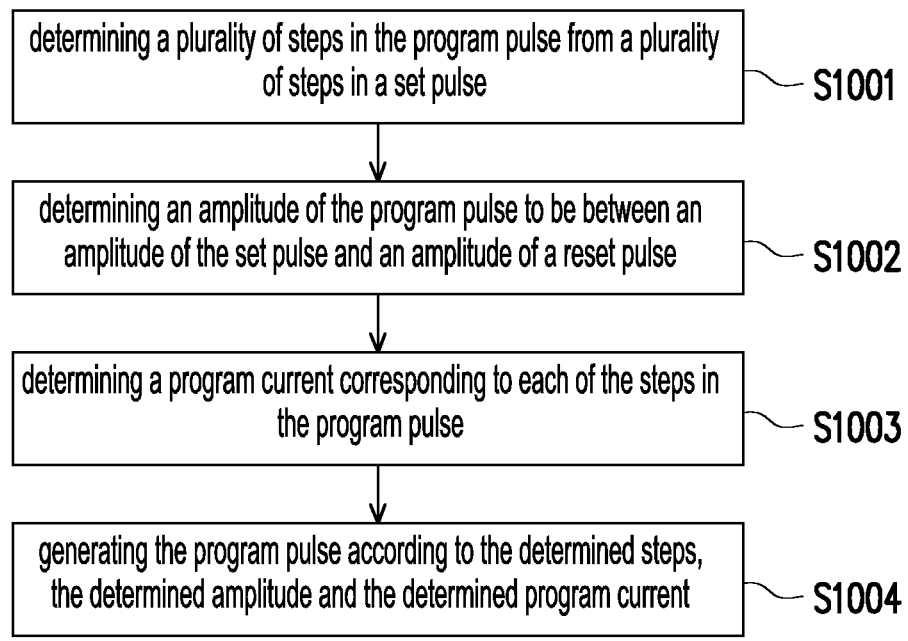
FIG. 10 illustrates a flowchart for generating a program pulse for a programming operation in a non-volatile memory device according to yet another exemplary embodiment of the disclosure.

FIG. 10 illustrates a flowchart of a method for generating a program pulse for a programming operation in a non-volatile memory device, the method includes following steps:

In step S1001, the memory controller 120 determines a plurality of steps in the program pulse from a plurality of steps in a set pulse.

In step S1002, the memory controller 120 determines an amplitude of the program pulse to be between an amplitude of the set pulse and an amplitude of a reset pulse with reference to FIG. 2.

In step S1003, the memory controller 120 determines a program current corresponding to each of the steps in the program pulse. In some embodiments, a difference between a plurality of program currents of the plurality of steps in the program pulse is equal to a ratio of a program current of the set pulse to a number of the steps in the set pulse. That is, the difference between the program currents $\Delta I$ of the plurality of the steps is determined as $\Delta I = I_{PGM}/N$.

In step S1004, the memory controller 120 generates the program pulse according to the determined steps, the determined amplitude and the determined program current. In some embodiments, the memory controller 120 generates the program pulse 213 by adjusting the program pulse 213 to be between the set pulse 211 and the reset pulse 212 with reference to FIG. 2, in which the set pulse 211 corresponds to N steps, and the program pulse 213 corresponds to N/2 steps.

By determining the program pulse in the programming operation of the non-volatile memory device instead of using the set pulse and the reset pulse to decrease or increase the memory cell resistances of the memory cells, waiting time of the memory cells in the non-volatile memory device to reach the target range is avoided.

In accordance with some embodiments, the non-volatile memory device that includes a memory array and a memory controller is introduced. The memory array includes a plurality of memory cells. The memory controller is configured to regulate a programming operation by applying a program pulse generated according to a set pulse and a reset pulse to each of the memory cells. The memory controller determines whether a memory cell resistance of each of the memory cells is within a target range and apply the program pulse to each of the memory cells until the memory cell resistances of all of the memory cells are within the target range.

In accordance with some embodiments, a method for programming a non-volatile memory device that includes a plurality of memory cells and a memory controller is provided, and the method includes the steps of: selecting at least one of the memory cells in a memory array; performing a programming operation on the memory cells by applying a program pulse generated according to a set pulse and a reset pulse to each of the memory cells; determining whether a memory cell resistance of each of the memory cells is within a target range; and applying the program pulse to each of the memory cells until the memory cell resistances of all of the memory cells are within the target range.

In accordance with some embodiments, a method of generating a program pulse for a programming operation in a non-volatile memory device is provided, and the method includes the steps of: determining a plurality of steps in the program pulse from a plurality of steps in a set pulse; determining an amplitude of the program pulse to be between an amplitude of the set pulse and an amplitude of a reset pulse; determining a program current corresponding to each of the steps in the program pulse, wherein a difference between the program currents of the steps in the program pulse is equal to a ratio of a program current of the set pulse to a number of the steps in the set pulse; and generating the program pulse according to the determined steps, the determined amplitude and the determined program current.

The foregoing has outlined features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A non-volatile memory device comprising:
a memory array, comprises a plurality of memory cells; and
a memory controller, configured to regulate a programming operation by applying a program pulse generated according to a set pulse and reset pulse to each of the memory cells,
wherein the memory controller determines whether a memory cell resistance of each of the memory cells is within a target range and apply the program pulse to each of the memory cells until the memory cell resistances of all of the memory cells are within the target range.

2. The non-volatile memory device of claim 1, wherein the memory controller
respectively checks whether the memory cell resistance of each of the memory cells is within the target range; and
keeps applying the program pulse to the memory cell, when the memory cell resistance of the memory cell is not within the target range.

3. The non-volatile memory device of claim 2, wherein the memory controller
stops applying the program pulse to the memory cell, when the memory cell resistance of the memory cell is within the target range.

4. The non-volatile memory device of claim 2, wherein after respectively checking whether the memory cell resistance of each of the memory cells is within the target range,
the memory controller determines whether the memory cell resistances of all of the memory cells in the memory array reach the target range.

5. The non-volatile memory device of claim 4, wherein when the memory cell resistances of all of the memory cells in the memory array do not reach the target range, the memory controller performs a next programming operation.

6. The non-volatile memory device of claim 4, wherein when the memory cell resistances of all the memory cells in the memory array reaches the target range, the memory controller terminates the programming operation.

7. The non-volatile memory device of claim 1, wherein the program pulse comprises a portion of a plurality of steps in the set pulse and an amplitude of the program pulse is between an amplitude of the set pulse and an amplitude of the reset pulse.

8. The non-volatile memory device of claim 7, wherein a difference between program currents of the plurality of steps in the program pulse is equal to a ratio of a program current of set pulse to a number of steps in the set pulse.

9. The non-volatile memory device of claim 8, wherein a number of the steps in the program pulse is half of the number of the steps in the set pulse.

10. The non-volatile memory device of claim 1, wherein the non-volatile memory device is a PCRAM.

11. A method for programming a non-volatile memory device comprising a plurality of memory cells and a memory controller, the method comprising:
selecting at least one of the memory cells in a memory array;
performing a programming operation on the memory cells by applying a program pulse generated according to a set pulse and a reset pulse to each of the memory cells;
determining whether a memory cell resistance of each of the memory cells is within a target range; and
applying the program pulse to each of the memory cells until the memory cell resistances of all of the memory cells are within the target range.

12. The method of claim 11, wherein the programming operation comprises:
respectively checking whether the memory cell resistance of each of the memory cells is within the target range; and
keeping applying the program pulse to the memory cells when the memory cell resistance of the memory cell is not within the target range; and
stopping applying the program pulse to the memory cell, when the memory cell resistance of the memory cell is within the target range.

13. The method of claim 12, wherein after respectively checking whether the memory cell resistance of each of the memory cells is within the target range, the method comprises:
determining whether the memory cell resistances of all of the memory cells in the memory array reach the target range.

14. The method of claim 13, wherein the method comprises:
when memory cell resistances of all of the memory cells in the memory array do not reach the target range, performing a next programming operation.

15. The method of claim 13, wherein the method comprises:
when memory cell resistances of all of the memory cells in the memory array reach the target range, terminating the programming operation.

16. The method claim 11, wherein the program pulse comprises a portion of a plurality of steps in the set pulse and an amplitude of the program pulse is between an amplitude of the set pulse and an amplitude of the reset pulse.

17. The method of claim 16, wherein a difference between program currents of the plurality of steps in the program pulse is equal to a ratio of a program current of the set pulse to a number of the steps in the set pulse.

18. The method of claim 17, wherein a number of the steps in the program pulse is half of the number of the steps in the set pulse.

19. A method of generating a program pulse for a programming operation in a non-volatile memory device, the method comprising:
determining a plurality of steps in the program pulse from a plurality of steps in a set pulse;
determining an amplitude of the program pulse to be between an amplitude of the set pulse and an amplitude of a reset pulse;

determining a program current corresponding to each of the steps in the program pulse, wherein a difference between the program currents of the steps in the program pulse is equal to a ratio of a program current of the set pulse to a number of the steps in the set pulse; and generating the program pulse according to the determined steps, the determined amplitude and the determined program current.

20. The method of claim 19, wherein a number of the steps in the program pulse is half of the number of the steps in the set pulse.

* * * * *